United States Patent [19]
Takiguchi et al.

[11] Patent Number: 5,394,872
[45] Date of Patent: Mar. 7, 1995

[54] METHOD OF MAGNETIC RESONANCE IMAGING

[75] Inventors: Kenji Takiguchi, Kodaira; Hidemi Shiono, Akigawa; Hiroyuki Itagaki, Kokubunji; Etsuji Yamamoto, Akishima, all of Japan

[73] Assignee: Hitachi, Ltd., Tokyo, Japan

[21] Appl. No.: 44,778

[22] Filed: Apr. 12, 1993

[30] Foreign Application Priority Data

Apr. 13, 1992 [JP] Japan .................. 4-092581

[51] Int. Cl.⁶ .................. A61B 5/055; G01R 33/20
[52] U.S. Cl. .................. 128/653.2; 128/653.3; 324/309; 324/306
[58] Field of Search .................. 128/653.2, 653.3; 324/306, 309

[56] References Cited

U.S. PATENT DOCUMENTS

| | | | |
|---|---|---|---|
| 5,042,485 | 8/1991 | Sano et al. | 128/653.2 |
| 5,043,665 | 8/1991 | Kuhara et al. | 324/309 |
| 5,168,228 | 12/1992 | Mansfield et al. | 324/309 |
| 5,221,898 | 6/1993 | Takiguchi et al. | 324/309 |

*Primary Examiner*—Krista M. Pfaffle
*Attorney, Agent, or Firm*—Antonelli, Terry, Stout & Kraus

[57] ABSTRACT

In a magnetic resonance imagining method, using an effect that a fluid flows out of a plane where it is selectively excited between the time of applying a 90° radio frequency pulse and the time of applying of a 180° radio frequency pulse, two, images are separately constructed from multiple echo signals which are sampled before applying the 180° radio frequency pulse and multiple echo signals which are sampled after applying the 180° radio frequency pulse. An image of the fluid flow and an image of a static part are separated from each other based on a difference between the two constructed images.

8 Claims, 5 Drawing Sheets

M1

M2

F

W

METHOD OF MAGNETIC RESONANCE IMAGING

BACKGROUND OF THE INVENTION

The present invention relates to an imaging method using a magnetic resonance imaging apparatus (hereinafter abbreviated to an MRI apparatus) and more particularly to a method for imaging a fluid flow in a human body, that is, a method of angiography.

As a conventional method for imaging a fluid flow with an MRI apparatus, a method for obtaining a target image from a plurality of images having different properties is known as represented by an example that only a fluid flow is extracted by subtraction of two images such as an image which is obtained by a flow-sensitive pulse sequence and an image which is obtained by a non-flow-sensitive pulse sequence. One of the methods is described in Magnetic Resonance in Medicine 12, pp. 1 to 13 (1989). According to this method, a fluid flow image can be obtained by subtraction of images which are obtained by two measurements when a waveform of a readout gradient magnetic field is changed to a flow encode pulse in which the phase rotation of magnetization in the fluid flow under the gradient field is enhanced and when it is changed to a flow compensation pulse in which the phase rotation of magnetization in the fluid flow under the gradient field is compensated.

According to the above prior art, the waveform of the readout gradient field is different between the flow sensitive pulse sequence and non-flow-sensitive pulse sequence, so that two measurements are necessary. Furthermore, according to the prior art, the measuring time is long and two measurements are necessary, so that there is a problem imposed in obtaining a blood flow image of a dynamic part such as a heart.

SUMMARY OF THE INVENTION

An object of the present invention is to provide an ultra high-speed imaging method for applying a readout gradient magnetic field while periodically inverting its polarity after applying a radio frequency pulse and for generating echo signals continuously or a method for imaging a fluid flow, wherein a fluid flow image can be obtained at ultra high speed by one measurement.

To accomplish the above object, the present invention includes the sequential steps of (a) selectively exciting a region of interest to be imaged by applying to the region of interest a first radio frequency pulse and a gradient magnetic field having a gradient in a first direction, the region of interest including a fluid part and a static part; (b) applying to the region of interest a readout gradient magnetic field having a gradient in a second direction perpendicular to the first direction while periodically inverting a polarity of the readout gradient magnetic field, and an encode gradient magnetic field having a gradient in a third direction perpendicular to both the first direction and the second direction; (c) measuring first multiple echo signals generated by the region of interest during the step (b); (d) selectively exciting said region of interest by applying to the region of interest a second radio frequency pulse and the gradient magnetic field having a gradient in the first direction; (e) applying to the region of interest the readout gradient magnetic field having a gradient in the second direction while periodically inverting the polarity of the readout gradient magnetic field, and the encode gradient magnetic field having a gradient in the third direction; (f) measuring second multiple echo signals generated by the region of interest during the step (e); (g) constructing a first image of the region of interest on the basis of the measured first multiple echo signals, and a second image of the region of interest on the basis of the measured second multiple echo signals; and (h) obtaining an image of only the fluid part of the region of interest on the basis of a difference between the first image and the second image. In this manner, images of the fluid part and the static part can be separated from each other.

According to an example of the imaging method of the present invention, when the echo planar method which is a typical ultra high-speed imaging method is applied to a region in which a fluid flows, an effect that a fluid flows out of the plane where it is selectively excited between the time that a 90° radio frequency pulse is applied and the time that a 180° radio frequency pulse is applied is used. When images are formed separately from multiple echo signals which are sampled before applying the 180° radio frequency pulse and from multiple echo signals which are sampled after applying the 180° radio frequency pulse, a difference due to the above effect is reflected in the two images, and based on a difference between the two images, an image of the fluid part and an image of a static part can be separated from each other.

DETAILED DESCRIPTION OF THE PREFERRED EMBODIMENTS

Figure 2:
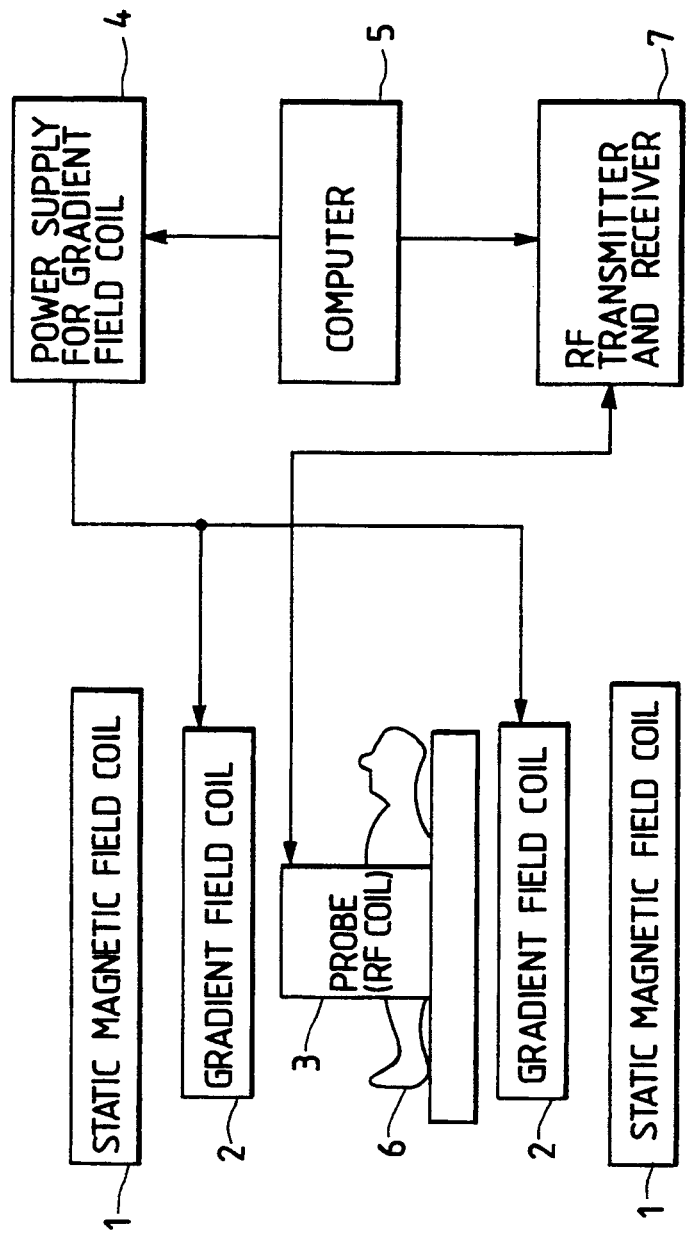
FIG. 2 is a block diagram showing an example of an MRI apparatus which executes the imaging method of the present invention.
Figure 3:
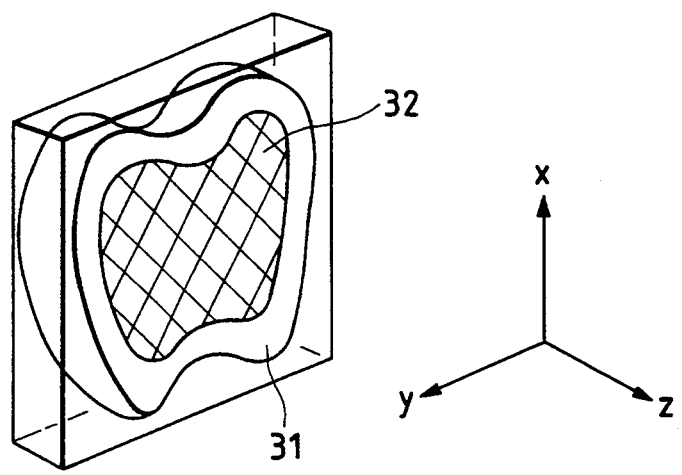
FIG. 3 is a perspective view of a model of a heart which is sliced along the XY plane.

FIG. 2 shows an outline of the structure of an example of an MRI apparatus which executes the present invention. This apparatus has a coil 1 for generating a static magnetic field, a gradient field coil 2 for generating a gradient magnetic field, a probe (RF coil) 3 for applying a radio frequency pulse to a human body 6 and detecting echo signals generated in the human body 6, a power supply 4 for the gradient field coil 2, an RF (radio frequency) transmitter and receiver 7 for transmitting a radio frequency pulse to the probe 3 and receiving echo signals detected by the probe 3, and a computer 5. The gradient field coil 2 has three sets of coils for providing gradients in the field intensity in three directions such as the static magnetic field direction (z direction) and two directions perpendicular to it (x and y directions). These gradient magnetic fields are called $G_z$, $G_x$, and $G_y$. In FIG. 2, the human body 6 lying in the z direction in a space enclosed by the probe 3 is an object to be inspected. The gradient magnetic fields, radio frequency pulses and sampling of signals are controlled by the computer 5 according to a pulse sequence. In this case, as shown in FIG. 3, a heart which is sliced along the XY plane is imaged while cardiac wall 31 contracts in the XY plane, and a blood flow 32 within the cardiac wall 31 flows out of the XY plane in the z direction.

Figure 1:
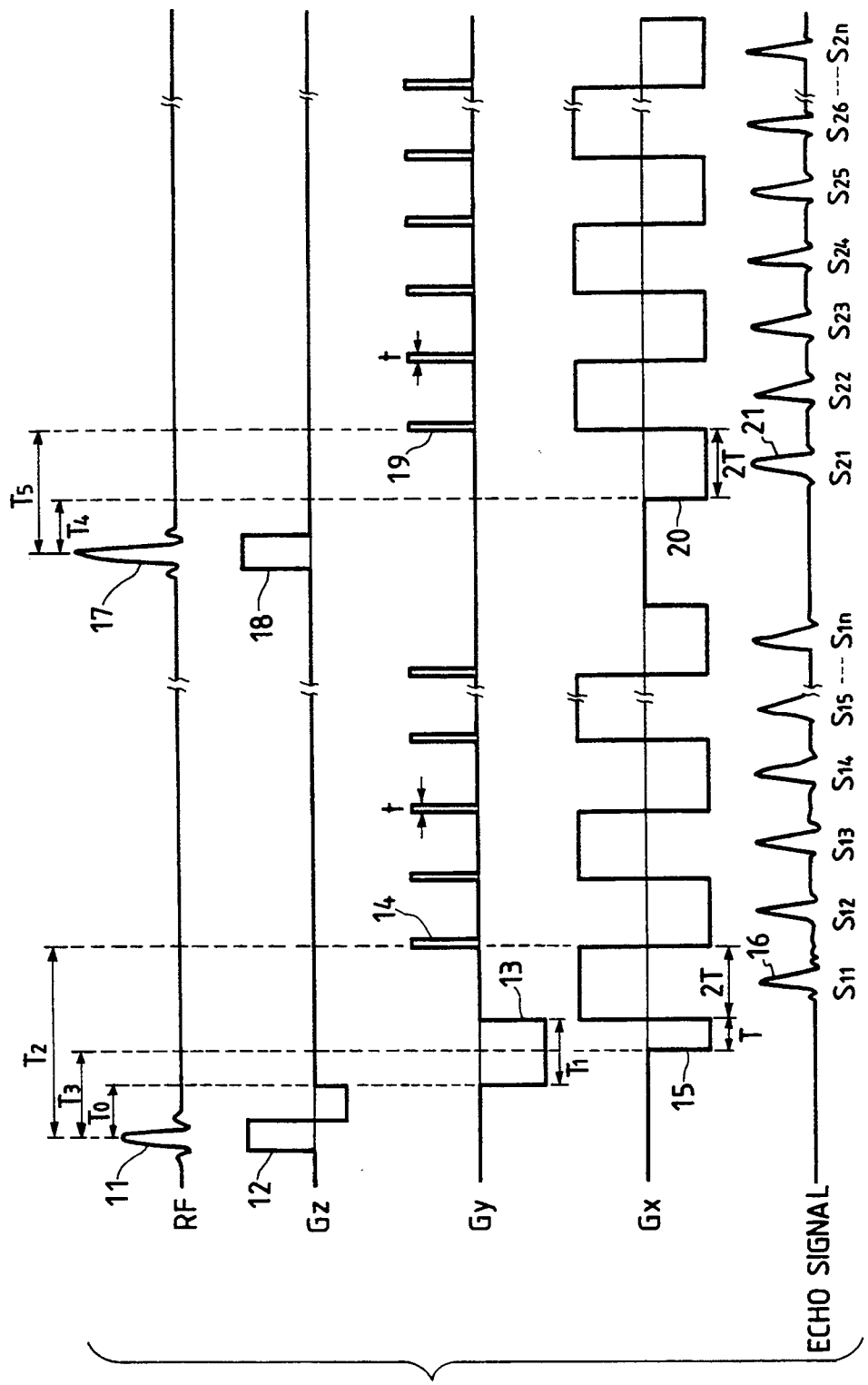
FIG. 1 is a timing chart showing a pulse sequence of an example of the imaging method of the present invention.

FIG. 1 shows a pulse sequence of a first embodiment of the present invention. The operation of this embodiment will be explained on this basis of the pulse sequence below.

First, a 90° radio frequency pulse 11 and $G_Z$ for providing a gradient in the field intensity in the z direction in a pulse shape as shown by a pulse 12 are applied so as to excite the region to be measured. By applying the radio frequency pulse and gradient magnetic field simultaneously, the region of interest can be selectively excited.

At a time of $T_3$ after the radio frequency pulse 11 is applied, the gradient magnetic field $G_x$ for providing a gradient in the field intensity in the x direction is applied for a time of T as shown by a pulse 15. Thereafter, the polarity of the the gradient magnetic field $G_x$ is inverted at intervals of 2T, therby inverting the gradient direction at intervals of 2T. This $G_x$ is called a readout gradient magnetic field. At a time of $T_0$, the gradient magnetic field $G_y$ for providing a gradient the field intensity in the y direction is applied for a time of $T_1$ as shown by a pulse 13. Furthermore, at a time of $T_2$, the gradient magnetic field $G_y$ is applied for a time of t which is shorter than the time of T at a polarity inverse to that to the pulse 13 as shown by a pulse 14. Thereafter, the gradient magnetic field of the pulse 14 is applied repeatedly for the time of t at intervals of 2T.

In this case, the product $(G_yT_1)$ of the gradient of the gradient magnetic field of the pulse 13 and the applying time $T_2$ is made equal to half of the total of products $(G_yt)$ of the gradient of the gradient magnetic field of the pulses 14 and the applying time t. This $G_y$ has a function for assigning position information in the y direction to the phase of an echo signal, so that it may be called an encode gradient magnetic field. During this period, an echo signal 16 is generated whenever the integration of $G_x$ with time becomes 0. Then, the multiple echo signals 16 are sampled and a string Of n echo signals $S_{1i}$ (i=1 to n) is obtained.

Next, a 180° radio frequency pulse 17 and $G_z$ for providing a gradient in the field intensity in the z direction are in a pulse shape as shown by a pulse 18 are applied so as to excite an XY plane which is the same as the XY plane excited by the 90° radio frequency pulse. Next, at a time of $T_4$ after the radio frequency pulse 17 is applied, the readout gradient field $G_x$ for providing a gradient in the field intensity in the x direction is applied for a time of 2T as shown by a pulse 20.

Thereafter, the gradient magnetic field $G_x$ is inverted at intervals of 2T, thereby inverting the gradient direction at intervals of 2 T. At a time of $T_5$, the encode gradient magnetic field $G_y$ for providing a gradient in the field intensity in the y direction is applied for a time of t which is shorter than the time of T as shown by a pulse 19 at the same polarity as the pulse 14. Thereafter, the encode gradient magnetic field of the pulse 19 is applied repeatedly for the time of t at intervals of 2T at the same polarity. During this period, an echo signal 21 is generated whenever the integration of $G_x$ with time becomes 0.

Figure 4A:
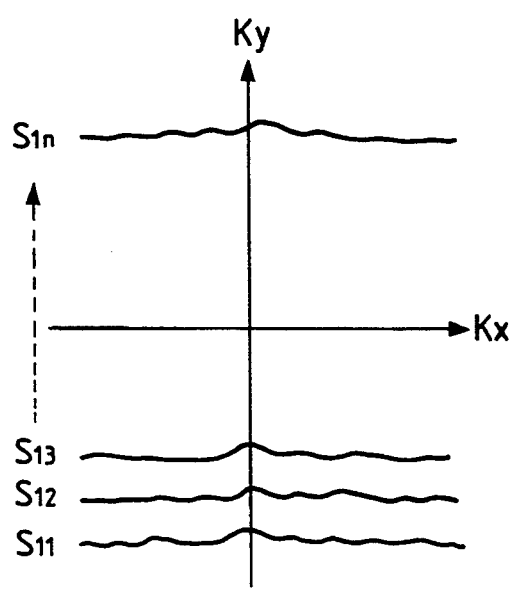
FIGS. 4A and 4B are drawings showing array directions of echo signal strings $S_{1i}$ and $S_{2i}$ in frequency space.
Figure 4B:
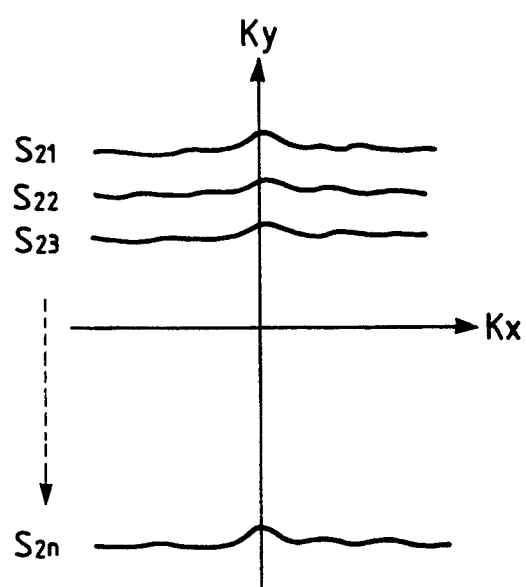
Figure 6A:
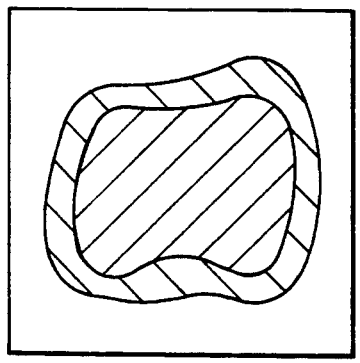
FIGS. 6A, 6B, 6C, and 6D are drawings showing examples of two constructed images and examples of two images obtained based on a difference between the two constructed images in an example of the imaging method of the present invention.
Figure 6B:
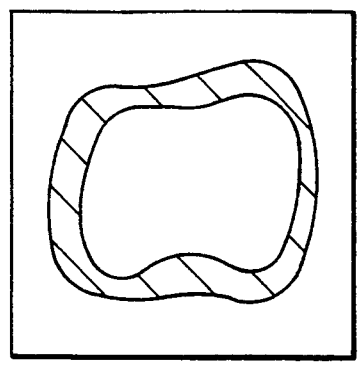

Then, the multiple echo signals 21 are sampled and a string of n echo signals $S_{2i}$ (i=1 to n) is obtained. Before and after the 180° radio frequency pulse, the polarity of the gradient magnetic field acting on a magnetic spin is inverted, so that, as shown in FIGS. 4A and 4B, the sampling directions of the echo signal string $S_{1i}$ and echo signal string $S_{2i}$ in frequency space are opposite to each other along the $K_y$ axis. Furthermore, by reconstructing images from $S_{1i}$ and $S_{2i}$ independently, images M1 and M2 shown in FIGS. 6A and 6B are obtained.

Figure 5A:
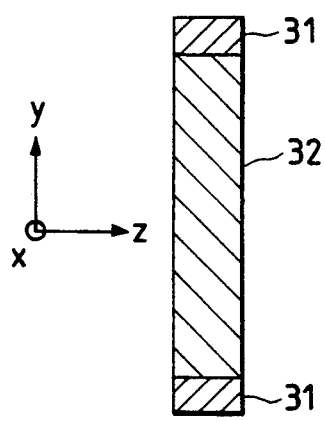
FIGS. 5A and 5B are drawings showing two examples of side sectional views of the sliced heart model shown in FIG. 3.
Figure 5B:
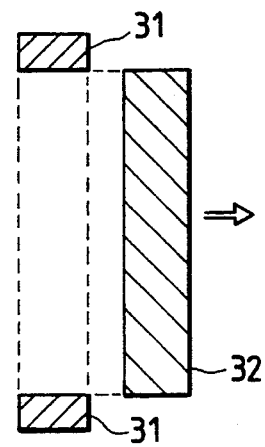

In this case, as shown in FIG. 5A, the first 90° radio frequency pulse excites both the cardiac wall 31 and the blood flow 32 in the XY plane. Therefore, the image M1 (FIG. 6A) which is constructed from the echo signal string $S_{1i}$ includes images of the cardiac wall and fluid flow. Next, as to changes in the XY plane during the time from applying of the 90° radio frequency pulse to applying of the 180° radio frequency pulse, as shown in FIG. 5B, the fluid which existed in the XY plane flows out of the XY plane and new fluid flows into the XY plane. Therefore, the 180° radio frequency pulse has a function for exciting the cardiac wall, which was previously excited by the 90° radio frequency pulse, once again, and exciting the new fluid, which flows in. However, due to the property of the 180° radio frequency pulse, a transverse-direction component of the magnetic spin which will be an echo signal is not generated from the new fluid which flows in. Therefore, the image M2 (FIG. 6B) which is constructed from the echo signal string $S_{2i}$ does not include an image of the fluid flow. Therefore, by using the two images M1 and M2, an image in which the fluid flow and cardiac wall are separated or enhanced can be obtained. Representing a signal of the cardiac wall by W and a signal of the fluid flow by F, the images M1 and M2 can be expressed by Formula (1) and Formula (2) when the signal decay caused by relaxation is ignored:

$$M1 = W + F \tag{1}$$

$$M2 = W \tag{2}$$

Figure 6C:
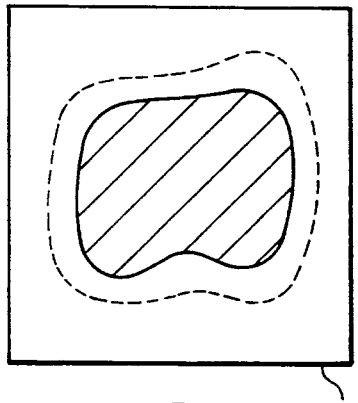
Figure 6D:
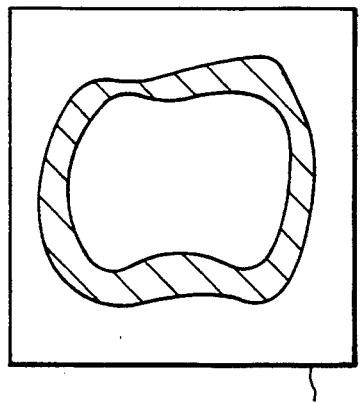

Therefore, from the above formulas, the fluid flow and cardiac wall can be expressed by Formula (3) and Formula (4):

$$F = M1 - M2 \tag{3}$$

$$W = M2 \tag{4}$$

where it is assumed that there is no signal decay caused by transverse relaxation between FIG. 4A and FIG. 4B and the signal intensity of W in Formula (1) is equal to that in Formula (2). However, even; when signal decay is considered by an appropriate compensation process the cardiac wall and fluid flow also can be separated. Images of the fluid flow and cardiac wall which are obtained based on a difference between the images in accordance with Formulas (3) and (4) are shown in FIGS. 6C and 6D.

Figure 7A:
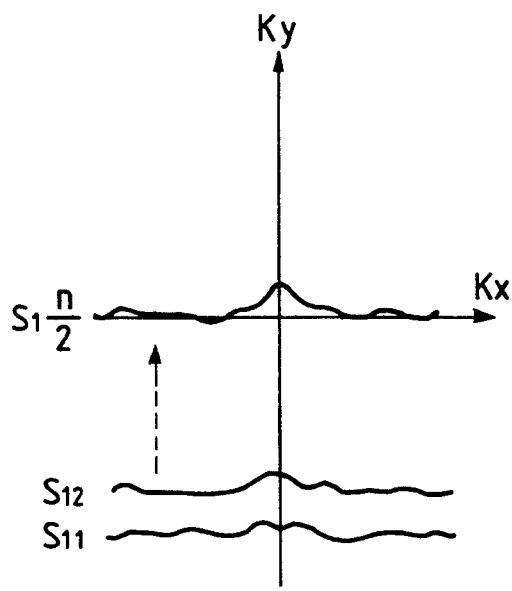
FIGS. 7A and 7B are drawings showing the sampling directions of echo signal strings $S_{1i}$ and $S_{2i}$ in frequency space when a half encode method is used.
Figure 7B:
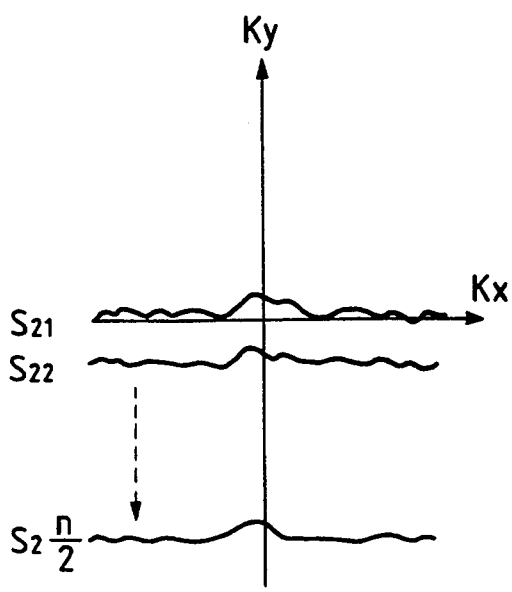

According to the aforementioned method, the whole area of the frequency space is measured. However, the encode gradient magnetic field $G_y$ of the pulse 13 may not be applied. In this case, the number of encode steps is n/2, and as shown in FIGS. 7A and 7B, only half the area of the frequency space is measured. This is called a half encode method, and the remaining unmeasured area is inferred by a mathematical method, and the measurement time can be reduced by half. The half encode method is described in detail in David A. Feinberg et al., "Halving MR Imaging Time by Conjugation: Demonstration at 3.5 kG", Radiology, 161, pp. 527-531, (November 1986).

Furthermore, according to the aforementioned method, the waveform of the readout gradient field is a rectangle. However, the waveform may be a sine wave. In this case, for image reconstructing, it is necessary to compensate for irregular sampling in the frequency space due to an echo signal generated by the sine waveform.

Figure 8A:
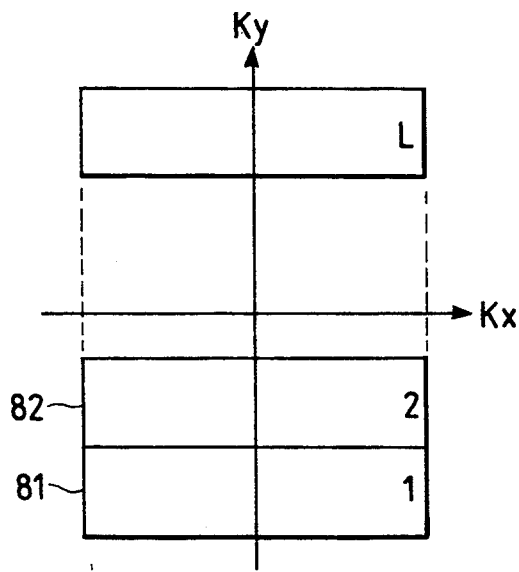
FIGS. 8A and 8B are drawings showing sampling directions in frequency space when a frequency space splitting method is used.
Figure 8B:
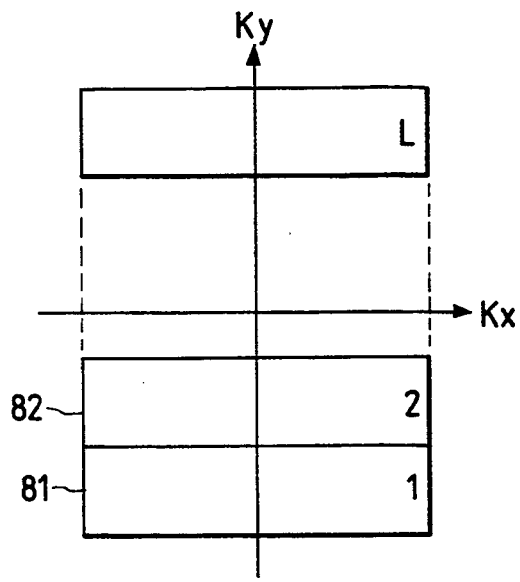

As a second embodiment, a case where the frequency space is split and several measurements are taken will be considered instead measuring of the whole area of the frequency space at one time. In this embodiment, as shown in FIGS. 8A and 8B, the frequency space is split into L parts and m lines are sampled in each part. In the same way as in the first embodiment shown in FIG. 1, first, a 90° radio frequency pulse 11 and $G_z$ for providing a gradient in the field intensity in the z direction in a pulse shape as shown in by pulse 12 are applied so as to excite the region to be measured.

At a time of $T_3$ after the radio frequency pulse 11 is applied, the gradient magnetic field $G_x$ for providing a gradient in the field intensity in the x direction is applied for a time of T as shown by a pulse 15. Thereafter, the polarity of the gradient magnetic field $G_x$ is inverted at intervals of 2T, therby inverting the gradient direction at intervals of 2T. At a time of $T_0$, the gradient magnetic field $G_y$ for providing a gradient in the field intensity in the y direction is applied for a time of $T_1$ as shown by a pulse 13. Furthermore, at a time of $T_2$, the gradient magnetic field $G_y$ is applied for a time of t which is shorter than the time of T at a polarity inverse to that of the pulse 13 as shown by a pulse 14. Thereafter, the gradient magnetic field of the pulse 14 is applied repeatedly for the time of t at intervals of 2T. In this case, the product $G_y \cdot T_1$ of the gradient of the gradient magnetic field of the pulse 13 and the applying time $T_1$ is made equal to half of the total of products $G_y \cdot t$ of the gradient of the gradient magnetic field of the pulses 14 and the applying time t. During this period, an echo signal 16 is generated whenever the integration of $G_x$ with time becomes 0. Then, the multiple echo signals 16 are sampled and a string of m echo signals $S_{1i}$ (i=1 to m) is obtained.

Next, a 180° radio frequency pulse 17 and $G_z$ for providing a gradient in the field intensity in the z direction in a pulse shape as shown by a pulse 18 are applied so as to excite an XY plane which is the same as the XY plane excited by the 90° radio frequency pulse. Next, at a time of $T_4$ after the radio frequency pulse 17 is applied, the readout gradient field $G_x$ for providing a gradient in the field intensity in the x direction is applied for a time of 2T as shown in a pulse 20. Thereafter, the gradient magnetic field $G_x$ is inverted at intervals of 2T, thereby inverting the gradient direction at intervals of 2T. At a time of $T_5$, the encode gradient magnetic field $G_y$ for providing a gradient in the field intensity in the y direction is applied for a time of t which is shorter than the time of T as shown by a pulse 19 at the same polarity as the pulse 14. Thereafter, the encode gradient magnetic field of the pulse 19 is applied repeatedly for the time of t at intervals of 2T at the same polarity. During this period, an echo signal 21 is generated whenever the integration of $G_x$ with time becomes 0. Then, the multiple echo signals 21 are sampled and a string of m echo signals $S_{2i}$ (i=1 to m) is obtained.

By the above process, a first region, that is, a region 81 shown in FIGS. 8A and 8B, is sampled. In the region 81, before and after the 180° radio frequency pulse, the polarity of the gradient magnetic field acting on a magnetic spin is inverted, so that the sampling directions in FIGS. 8A and 8B are opposite to each other along the $K_y$ axis.

Next, when the applied amount of the encode gradient magnetic field of the pulse 13 is reduced by $G_y \cdot m \cdot t$ and a above process is repeated, the next region, that is, a region 82 shown in FIGS. 8A and 8B, is sampled. When the applied amount of the encode gradient magnetic field of the pulse 13 is shifted by an amount corresponding to m encode steps, the sampling start position in the frequency space is shifted by m lines. When the pulse sequence is repeated L times while shifting the applied amount of the encode gradient magnetic field of the pulse 13 by m encode steps each time the whole area of the frequency space is sampled and n echo signals are finally obtained in FIGS. 8A and 8B in the same way as in the first embodiment.

Finally, by reconstructing images using the echo signal string $S_{1i}$ and signal string $S_{2i}$, images M1 and M2 are obtained. When Formula (3) and Formula (4) are used, images of the fluid flow and cardiac wall are obtained. When the measurement method for splitting the frequency space is used, the sampling count can be increased so that improvement of the resolution can be obtained. Alternatively, the measuring time per each repetition of the pulse sequence can be shortened by decreasing the sampling count so that a reduction of the effect of signal decay caused by transverse relaxation can be obtained. There are no restrictions on how to split the frequency space. The frequency space can be split by an interleaving method for sampling lines alternately.

According to an example of the method of the present invention, using an effect that a fluid flows out of a plane where it is selectively excited between the time of applying a 90° radio frequency pulse and the time of applying a 180° radio frequency pulse by the ultra high-speed imaging method, two images are separately construed by using multiple echo signals which are sampled before applying the 180° radio frequency pulse and multiple echo signals which are sampled after applying the 180° radio frequency pulse, and an image of the fluid flow and an image of a static part are separated from each other in one measurement based on a difference between the two constructed images.

What is claimed is:

1. A method of magnetic resonance imaging comprising the sequential steps of:
   (a) selectively exciting a region of interest to be imaged by applying to the region of interest a first radio frequency pulse and a gradient magnetic field having a gradient in a first direction, the region of interest including a fluid part and a static part;
   (b) applying to the region of interest a readout gradient magnetic field having a gradient in a second direction perpendicular to the first direction while periodically inverting a polarity of the readout gradient magnetic fields, and an encode gradient magnetic field having a gradient in a third direction perpendicular to both the first direction and the second direction;

(c) measuring first multiple echo signals generated by the region of interest during the step (b);

(d) selectively exciting said region of interest by applying to the region of interest a second radio frequency pulse and the gradient magnetic field having a gradient in the first direction;

(e) applying to the region of interest the readout gradient magnetic field having a gradient in the second direction while periodically inverting the polarity of the readout gradient magnetic fields, and the encode gradient magnetic field having a gradient in the third direction;

(f) measuring second multiple echo signals generated by the region of interest during the step (e);

(g) constructing a first image of the region of interest on the basis of the measured first multiple echo signals, and a second image of the region of interest on the basis of the measured second multiple echo signals; and (h) obtaining an image of only the fluid part of the region of interest on the basis of a difference between the first image and the second image.

2. A method of magnetic resonance imaging according to claim 1, wherein a frequency space to be measured is divided into a plurality of regions;

wherein said first and second multiple echo signals are measured repeatedly in each of the regions; and wherein said first and second images are constructed on the basis of said first and second multiple echo signals measured repeatedly in each of the regions.

3. A method of magnetic resonance imaging according to claim 1, wherein said readout gradient magnetic field has a sine waveform.

4. A method of magnetic resonance imaging according to claim 3, wherein a frequency space to be measured is divided into two halves;

wherein the first multiple echo signals and the second multiple echo signals are measured in only one of the two halves of the frequency space; and wherein the first image and the second image are constructed only on the basis of the first multiple echo signals and the second multiple echo signals measured in only one of the two halves of the frequency space.

5. A method of magnetic resonance imaging according to claim 1, wherein a frequency space to be measured is divided into two halves;

wherein the first multiple echo signals and the second multiple echo signals are measured in only one of the two halves of the frequency space; and wherein the first image and the second image are constructed only on the basis of the first multiple echo signals and the second multiple echo signals measured in only one of the two halves of the frequency space.

6. A method of magnetic resonance imaging according to claim 1, wherein a frequency space to be measured is divided into two halves, and only one of the two halves is divided into a plurality of regions;

wherein the first multiple echo signals and the second multiple echo signals are measured repeatedly in each of the regions; and wherein the first image and the second image are constructed only on the basis of the first multiple echo signals and the second multiple echo signals measured repeatedly in each of the regions.

7. A method of magnetic resonance imaging according to claim 1, wherein the image of the fluid part of the region of interest represents fluid flowing through a slice of the region of interest, the slice being perpendicular to the first direction.

8. A method of magnetic resonance imaging according to claim 1, wherein the step (h) includes compensating for signal decay due to transverse relaxation occurring between measurement of the first multiple echo signals in the step (c) and measurement of the second multiple echo signals in the step (f).

* * * * *